(12) United States Patent
Watanabe et al.

(10) Patent No.: US 7,252,925 B2
(45) Date of Patent: Aug. 7, 2007

(54) NITROGEN-CONTAINING ORGANIC COMPOUND, RESIST COMPOSITION AND PATTERNING PROCESS

(75) Inventors: Takeru Watanabe, Niigata-ken (JP); Takeshi Kinsho, Niigata-ken (JP); Katsuya Takemura, Niigata-ken (JP); Akihiro Seki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/974,759

(22) Filed: Oct. 28, 2004

(65) Prior Publication Data

US 2005/0095533 A1 May 5, 2005

(30) Foreign Application Priority Data

Oct. 29, 2003 (JP) .............................. 2003-368421

(51) Int. Cl.
  G03F 7/004 (2006.01)
  G03C 5/00 (2006.01)
  C07D 235/00 (2006.01)
  C07D 401/00 (2006.01)

(52) U.S. Cl. .................. 430/270.1; 430/325; 430/326; 430/926; 548/304.4; 546/273.4

(58) Field of Classification Search .............. 546/273.4
  See application file for complete search history.

(56) References Cited

U.S. PATENT DOCUMENTS

| 4,491,628 | A |   | 1/1985  | Ito et al. |
| 5,310,619 | A |   | 5/1994  | Crivello et al. |
| 5,436,262 | A | * | 7/1995  | Mantovanini et al. ...... 514/394 |
| 6,004,724 | A |   | 12/1999 | Yamato et al. |
| 6,261,738 | B1|   | 7/2001  | Asakura et al. |
| 6,352,985 | B1| * | 3/2002  | Yamasaki et al. ........ 514/227.8 |
| 6,908,722 | B2| * | 6/2005  | Ebata et al. ............. 430/270.1 |
| 7,022,459 | B2| * | 4/2006  | Kodama .................. 430/270.1 |

FOREIGN PATENT DOCUMENTS

| JP | 63-27829   | A  | 2/1988  |
| JP | 2-27660    | B2 | 6/1990  |
| JP | 5-158239   | A  | 6/1993  |
| JP | 5-232706   | A  | 9/1993  |
| JP | 5-249662   | A  | 9/1993  |
| JP | 5-249683   | A  | 9/1993  |
| JP | 5-257282   | A  | 10/1993 |
| JP | 5-289322   | A  | 11/1993 |
| JP | 5-289340   | A  | 11/1993 |
| JP | 6-194834   | A  | 7/1994  |
| JP | 6-242605   | A  | 9/1994  |
| JP | 6-242606   | A  | 9/1994  |
| JP | 6-263716   | A  | 9/1994  |
| JP | 6-266100   | A  | 9/1994  |
| JP | 6-266111   | A  | 9/1994  |
| JP | 7-92678    | A  | 4/1995  |
| JP | 7-92680    | A  | 4/1995  |
| JP | 7-92681    | A  | 4/1995  |
| JP | 07-120929  | A  | 5/1995  |
| JP | 7-128859   | A  | 5/1995  |
| JP | 7-134419   | A  | 5/1995  |
| JP | 9-95479    | A  | 4/1997  |
| JP | 9-208554   | A  | 8/1997  |
| JP | 9-230588   | A  | 9/1997  |
| JP | 2000-314956| A  | 11/2000 |
| JP | 6-263717   | A  | 9/2004  |
| WO | WO 9210491 | *  | 6/1992  |

OTHER PUBLICATIONS

Brain, C.T. et al., Tetrahedron Letters 43(10) 2002 1893-1895.*
Chemical Abstract DN 135:164628, Kucukbay, H. et al. Arzneimittel-Forschung, 2001, 51(5), 420-424.*
Ozdemir, I. et al., Eur.J.Inorg.Chem. 2004, 418-422.*
Hinsberg et al., "Fundamental studies of airborne chemical contamination of chemically amplified resists", Journal of Photopolymer Science and Technology, vol. 6, No. 4 (1993), pp. 535-546.
Kumada et al., "Study on over-top coating of positive chemical amplification resists for KrF excimer laser lithography", Journal of Photopolymer Science and Technology, vol. 6, No. 4 (1993), pp. 571-574.
Hatakeyama et al., "Investigation of discrimination enhancement with new modeling for polyhydroxystyrene positive resists", Journal of Photopolymer Science and Technology, vol. 13, No. 4 (2000), pp. 519-524.
Airimitsu et al., "Sensitivity enhancement of chemical- amplification-type photoimaging materials by acetoacetic acid derivatives", Journal of Photopolymer Science and Technology, vol. 8, No. 1 (1995), pp. 43-44, 45-46.
Airimutsu et al., "Effect of phenolic hydroxyl residues on the improvement of acid-proliferation-type photoimaging materials", Journal of Photopolymer Science and Technology, vol. 9, No. 1 (1996), pp. 29-30.

* cited by examiner

*Primary Examiner*—Rosemary Ashton
(74) *Attorney, Agent, or Firm*—Birch, Stewart, Kolasch & Birch, LLP

(57) ABSTRACT

Resist compositions comprising nitrogen-containing organic compounds having a benzimidazole structure and a specific ether chain moiety have an excellent resolution, form precisely configured patterns with minimized roughness of sidewalls and are useful in microfabrication using electron beams or deep-UV light.

6 Claims, No Drawings

US 7,252,925 B2

NITROGEN-CONTAINING ORGANIC COMPOUND, RESIST COMPOSITION AND PATTERNING PROCESS

CROSS-REFERENCE TO RELATED APPLICATION

This non-provisional application claims priority under 35 U.S.C. §119(a) on Patent Application No. 2003-368421 filed in Japan on Oct. 29, 2003, the entire contents of which are hereby incorporated by reference.

TECHNICAL FIELD

The present invention relates to a novel nitrogen-containing organic compound, a chemically amplified resist composition comprising the same and suitable for microfabrication technology, and a patterning process using the resist composition.

BACKGROUND ART

Of the efforts currently being made to achieve a finer pattern rule in the drive for higher integration and operating speeds in LSI devices, deep-ultraviolet lithography is thought to hold particular promise as the next generation in microfabrication technology. Deep-UV lithography is capable of fabrication to dimensions of 0.2 μm or less and, when a resist having low light absorption is used, can form patterns with sidewalls that are nearly perpendicular to the substrate. One technology that has attracted a good deal of attention recently utilizes high-intensity KrF and ArF excimer lasers as the deep-UV light source. This technology is being used in mass production, prompting a desire for resists having a low light absorption and a high sensitivity.

Acid-catalyzed, positive-working chemically amplified resists (e.g., U.S. Pat. No. 4,491,628 and U.S. Pat. No. 5,310,619, or JP-B 2-27660 and JP-A 63-27829) developed in response to the above needs are endowed with excellent properties, including a high sensitivity, high resolution and good dry-etching resistance, which make them especially promising as resists for deep-UV lithography.

However, one problem with chemically amplified resists is that, when the standing time from exposure to post exposure bake (PEB) is long, the line pattern formed during patterning acquires a "T-top" shape characterized by widening at the top of the pattern. This defect is called "post exposure delay" (PED). Another problem with such resists is "footing," which is a widening of the resist pattern close to the substrate that occurs on a basic substrate, particularly a silicon nitride or titanium nitride substrate. The T-top effect is believed to result from a decrease in solubility at the surface of the resist film, and the footing effect at the substrate surface appears to arise from a decline in solubility near the substrate. An additional problem is that elimination of acid-labile groups is a dark reaction which proceeds during the interval between the exposure step and the PEB step, reducing the final dimensions of the pattern lines.

These problems represent major drawbacks to the practical use of chemically amplified resists. Because of such defects, prior-art positive-working chemically amplified resists are difficult to control the dimension in the lithographic process, and dimensional control is also lost during dry etching of the substrate (see, for example, W. Hinsberg et al., Journal of Photopolymer Science and Technology, Vol. 6, No. 4, 535-546 (1993); and T. Kumada et al., ibid., 571-574).

In positive-working chemically amplified resists, the problems of PED and footing on the substrate surface are believed to be caused in large part by basic compounds which are either airborne or present on the surface of the substrate. The acid at the surface of the resist film that has been generated by exposure reacts with airborne bases and is deactivated. Prolonged standing until post-exposure bake results in a corresponding increase in the amount of deactivated acid, making it more difficult for the acid-labile groups to decompose. A substantially insolubilized layer thus forms at the surface, giving the resist pattern a T-top shape.

It is well-known in the art that the addition of a nitrogen-containing compound can reduce the influence of airborne bases, and is thus effective also against PED (see, for example, JP-A 5-232706, JP-A 5-249683, JP-A 5-158239, JP-A 5-249662, JP-A 5-257282, JP-A 5-289322, JP-A 5-289340, JP-A 6-194834, JP-A 6-242605, JP-A 6-242606, JP-A 6-263716, JP-A 6-263717, JP-A 6-266100, JP-A 6-266111, JP-A 7-128859, JP-A 7-92678, JP-A 7-92680, JP-A 7-92681, JP-A 7-120929 and JP-A 7-134419).

General nitrogen-containing compounds having significant effects include amine compounds and amide compounds. Specific examples include pyridine, polyvinylpyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and 2-(p-chlorophenyl)-4,6-trichloromethyl-s-triazine.

These nitrogen-containing compounds are weak bases and can alleviate the T-top problem, but such compounds are unable to control the reaction when highly reactive acid-labile groups are used; that is, they cannot control acid diffusion. With the addition of a weak base, the dark reactions particularly in PED proceed even in unexposed areas, causing slimming of the line dimensions and a loss of film thickness from the line surface during PED. To overcome such problems, it is desirable to add a strong base. However, a higher basicity is not necessarily better. For example, good effects cannot be obtained with the addition of the following super-strong bases: DBU (1,8-diazabicyclo[5.4.0]-7-undecene), DBN (1,5-diazabicyclo[4.3.0]-5-nonene) and proton sponge (1,8-bis(dimethylamino)naphthalene) or quaternary ammonium hydroxides such as tetramethylammonium hydroxide.

The addition of a nitrogen-containing compound having an excellent ability to capture generated acid works well to increase the contrast and thereby achieve a high resolution. The dissociation constants of the acid and base within water can be explained in terms of pKa, but the acid capturing ability within the resist film is not directly related to the pKa of the base. This is discussed by Hatakeyama et al. in Journal of Photopolymer Science and Technology, Vol. 13, No. 4, pp. 519-524 (2000). It is also known that the profile and the degree of sidewall roughness of a pattern are dictated by the identity of a nitrogen-containing compound used.

SUMMARY OF THE INVENTION

It is therefore an object of the invention to provide a chemically amplified resist composition which exhibits a high resolution and forms a precisely configured pattern with minimized roughness of sidewalls, when processed by photolithography for micropatterning, especially lithography using irradiation such as a KrF laser, ArF laser, $F_2$ laser, extremely short UV, electron beam or x-ray. Another object of the invention is to provide a patterning method which uses the resist composition. A further object of the invention is to provide a novel nitrogen-containing organic compound suited for use in the resist composition.

In a first aspect, the invention provides a nitrogen-containing organic compound having the general formula (1).

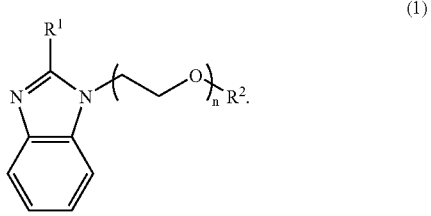

(1)

Herein $R^1$ is hydrogen, methyl, ethyl or phenyl, $R^2$ is a straight, branched or cyclic alkyl group of 1 to 10 carbon atoms, and n is 1, 2, 3, 4, 5 or 6. The nitrogen-containing organic compound having a benzimidazole structure and an ether chain moiety of a specific structure, represented by formula (1), can be readily synthesized in high yields by the method to be described later, and be combined in proper amounts with a base resin and other components to formulate a resist composition which exhibits a high resolution and forms a precisely configured pattern with minimized roughness of sidewalls. For a certain application, a proper choice of $R^1$, $R^2$ and n enables to optimize resist characteristics including a pattern profile.

In a second aspect, the invention provides a chemically amplified resist composition comprising at least one nitrogen-containing organic compound having the general formula (1). This chemically amplified resist composition exhibits a high resolution and forms a precisely configured pattern with minimized roughness of sidewalls. For a certain application, a proper choice of $R^1$, $R^2$ and n enables to optimize resist characteristics including a pattern profile.

In a third aspect, the invention provides a positive-working chemically amplified resist composition comprising:

(A) a nitrogen-containing organic compound of the general formula (1);

(B) an organic solvent;

(C) a base resin having an acid labile group-protected acidic functional group which is alkali-insoluble or substantially alkali-insoluble, but becomes alkali-soluble when the acid labile group is eliminated; and (D) a photoacid generator.

The chemically amplified positive resist composition exhibits a high resolution and forms a precisely configured pattern with minimized roughness of sidewalls. For a certain application or a certain combination of components (B) to (D), a proper choice of $R^1$, $R^2$ and n in formula (1) enables to optimize resist characteristics including a pattern profile.

In a fourth aspect, the invention provides a negative-working chemically amplified resist composition comprising:

(A) a nitrogen-containing organic compound of the general formula (1);

(B) an organic solvent;

(C') a base resin which is alkali-soluble, but becomes substantially alkali-insoluble when crosslinked with a crosslinking agent;

(D) a photoacid generator; and (E) a crosslinking agent which induces crosslinkage under the action of an acid.

The chemically amplified negative resist composition exhibits a high resolution and forms a precisely configured pattern with minimized roughness of sidewalls. For a certain application or a certain combination of components (B) to (E), a proper choice of $R^1$, $R^2$ and n in formula (1) enables to optimize resist characteristics including a pattern profile.

In a fifth aspect, the invention provides a patterning process comprising the steps of (1) applying any of the chemically amplified resist compositions defined above onto a substrate; (2) heat treating the applied resist, then exposing the heat-treated resist through a photomask to high-energy radiation having a wavelength of up to 300 nm or an electron beam; and (3) heat treating the exposed resist, then developing the resist with a developer. By this process, a precisely configured pattern with minimized roughness of sidewalls can be formed at a high resolution.

The chemically amplified resist composition prepared by compounding the nitrogen-containing organic compound of formula (1) exhibits a high resolution, forms a pattern having a precise configuration and least sidewall roughness, and is useful in lithographic micropatterning using electron beams and deep UV. The nitrogen-containing organic compound of formula (1) exerts best effects when compounded in resists adapted for KrF laser, ArF laser, $F_2$ laser, EUV, EB or x-ray lithography, making the resists ideal as a micropatterning material in VLSI fabrication.

DESCRIPTION OF THE PREFERRED EMBODIMENTS

Nitrogen Compound

The inventors sought for a compound which when compounded in chemically amplified resist compositions, is effective for achieving a high resolution, defining a satisfactory pattern configuration, and suppressing the roughness of pattern sidewalls. The inventors have discovered that a nitrogen-containing organic compound having a benzimidazole structure and an ether chain moiety of a specific structure, represented by the general formula (1), can be readily synthesized in high yields by the method to be described later, and that the compound can be combined in proper amounts with a base resin and other components to formulate a chemically amplified photoresist composition which exhibits a high resolution and forms a precisely configured pattern with least sidewall roughness.

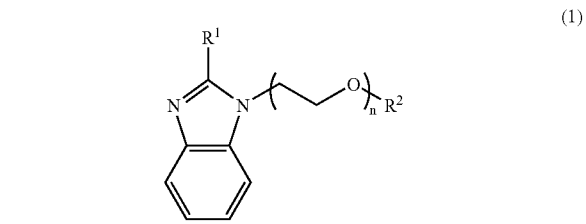

(1)

In formula (1), $R^1$ is hydrogen, methyl, ethyl or phenyl. $R^2$ is a straight, branched or cyclic alkyl group of 1 to 10 carbon atoms, such as methyl, ethyl, propyl, isopropyl, butyl, isobutyl, t-butyl, pentyl, hexyl, decyl, cyclopentyl or cyclohexyl. The subscript n is equal to 1, 2, 3, 4, 5 or 6.

Illustrative, non-limiting examples of the nitrogen-containing organic compounds are given below. Note that Me stands for methyl, Et stands for ethyl and Ph stands for phenyl.

Amine 1
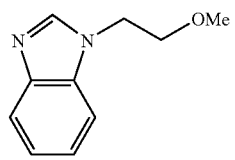

Amine 2
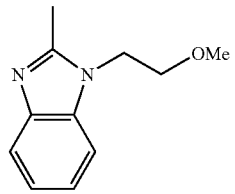

Amine 3
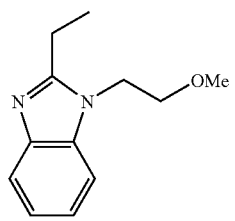

Amine 4
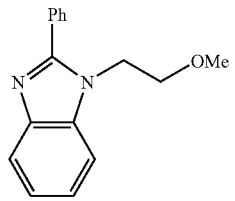

Amine 5
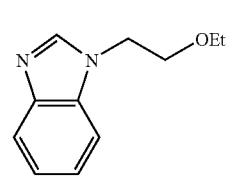

Amine 6
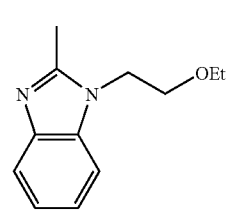

Amine 7
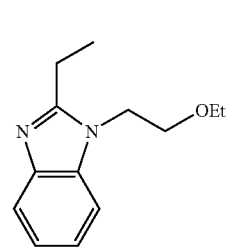

-continued

Amine 8
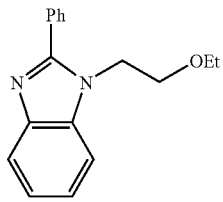

Amine 9
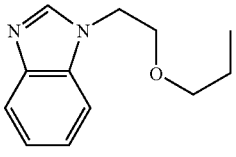

Amine 10
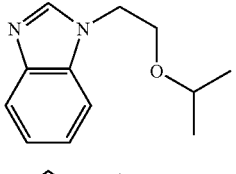

Amine 11
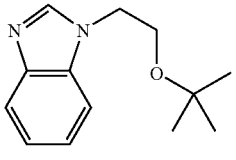

Amine 12
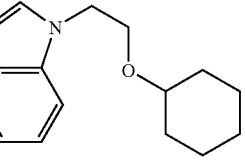

Amine 13
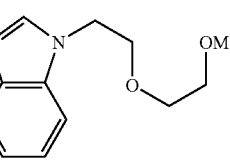

Amine 14
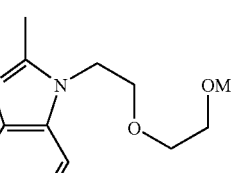

Amine 15
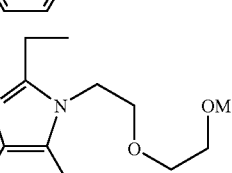

Amine 16
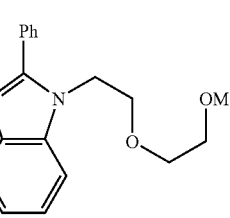

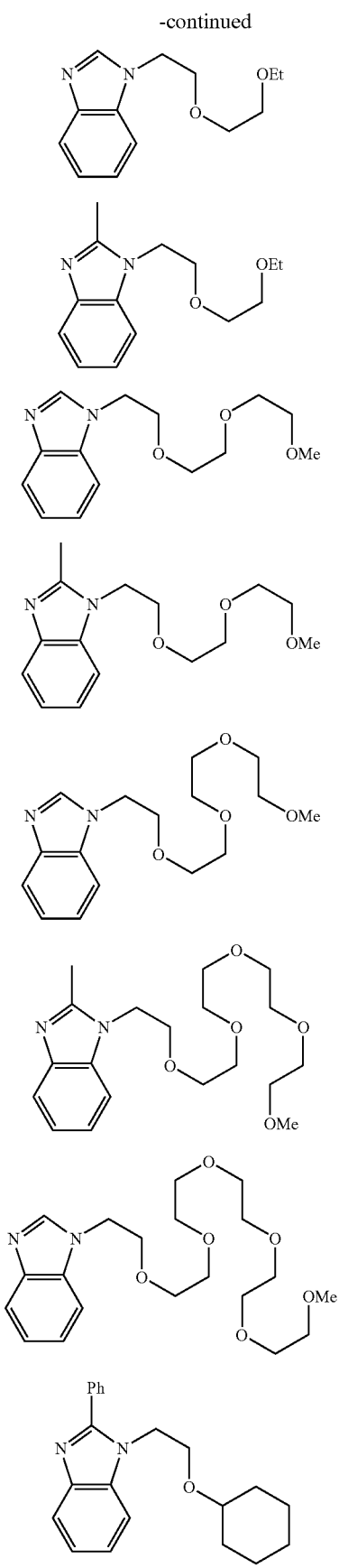

Amine 17

Amine 18

Amine 19

Amine 20

Amine 21

Amine 22

Amine 23

Amine 24

According to the invention, the nitrogen-containing organic compounds have a benzimidazole structure and an ether chain moiety of a specific structure. The ether group of specific structure having a high kinetic affinity to acids can be placed at a suitable position near the amine nitrogen in the benzimidazole structure that ultimately captures the acid. As a result, generated acids can be rapidly captured, enabling photoresists containing these nitrogen-containing organic compounds to achieve a high resolution. By selecting for a certain application an optimal combination from among the possible combinations of $R^1$, $R^2$ and n in formula (1), the volatility, basicity, and acid capturing rate of the nitrogen-containing organic compound and the acid diffusion rate within the resist can be suitably adjusted so as to comply with a particular combination of the resist polymer with the photoacid generator. This eventually enables to adjust resist material characteristics such as pattern profile.

The nitrogen-containing organic compound of formula (1) according to the invention is preferably prepared by an optimum method that is selected in accordance with the structure of the compound. One typical method relies on N-alkylation of benzimidazole compounds. This typical method is described below in detail although the synthesis method is not limited thereto.

Basically, the preparation method relying on N-alkylation of a benzimidazole compound of formula (2) using an alkylating agent of formula (3) and a base is applicable to the synthesis of all nitrogen-containing organic compounds of formula (1).

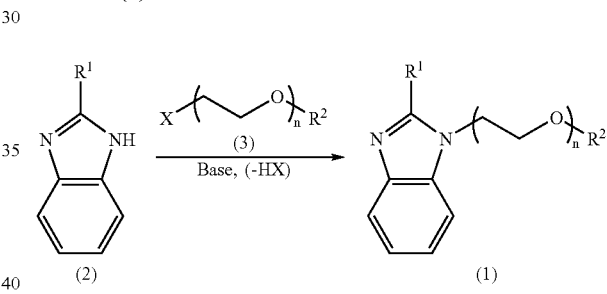

Herein, $R^1$ is hydrogen, methyl, ethyl or phenyl; $R^2$ is a straight, branched or cyclic alkyl group of 1 to 10 carbon atoms; n is equal to 1, 2, 3, 4, 5 or 6; and X is a leaving group.

Suitable leaving groups represented by X include chlorine, bromine, iodine atoms, alkylsulfonyloxy groups such as methanesulfonyloxy, and arylsulfonyloxy groups such as p-toluenesulfonyloxy. The alkylating agent (3) is desirably used in an amount of 0.3 to 10 moles, more desirably 0.5 to 2 moles per mole of the benzimidazole compound (2).

The reaction may be performed in a solvent or without a solvent. Suitable solvents, when used, include alcohols such as methanol, ethanol, isopropyl alcohol, t-butyl alcohol and ethylene glycol; hydrocarbons such as hexane, heptane, benzene, toluene and xylene; ethers such as diethyl ether, dibutyl ether, tetrahydrofuran, 1,4-dioxane, and diglyme; chlorinated solvents such as methylene chloride, chloroform, and 1,2-dichloroethylene; aprotic polar solvents such as N,N-dimethylformamide, N,N-dimethylacetamide, dimethyl sulfoxide, and N-methylpyrrolidone; carboxylic acids such as formic acid and acetic acid; esters such as ethyl acetate and butyl acetate; ketones such as acetone and 2-butanone; nitriles such as acetonitrile; amines such as pyridine and triethylamine; and water. Any one selected from the foregoing solvents or a mixture of any may be used depending on reaction conditions. The reaction temperature may be selected from a range of −20° C. to the reflux temperature of the solvent, in accordance with the reaction rate.

The base used in the invention may be selected in accordance with the reaction conditions from among amines such as pyridine, triethylamine, diisopropylethylamine, 4-dimethylaminopyridine and imidazole; metal alkoxides such as sodium methoxide, sodium ethoxide and potassium t-butoxide; metal carbonates such as sodium carbonate, potassium carbonate and cesium carbonate; hydroxides such as sodium hydroxide, potassium hydroxide and tetramethylammonium hydroxide; metal hydrides such as sodium hydride and potassium hydride; organometallic compounds such as butyllithium and ethyl magnesium bromide; and metal amides such as lithium diisopropylamide. Any one or mixture of these bases may be used. Alternatively, the benzimidazole compound (2) itself may serve as the base. The desired amount of the base used is from 0.3 to 10 moles, and especially from 0.5 to 5 moles, per mole of the benzimidazole compound (2).

A catalyst may be added to increase the reaction rate. Suitable catalysts include iodides such as sodium iodide, lithium iodide and tetrabutylammonium iodide, and bromides such as sodium bromide, lithium bromide and tetrabutylammonium bromide. An appropriate amount of the catalyst, when added, is from 0.001 to 2 moles, and especially from 0.005 to 0.5 mole, per mole of the benzimidazole compound (2). To maximize the final yield, it is desirable to monitor the progress of the reaction using gas chromatography (GC) or thin-layer chromatography (TLC) until the reaction is complete. Generally, the reaction time is about 0.1 to 100 hours. The benzimidazole compound having the desired ether chain (1) is isolated by a conventional aqueous work-up from the reaction mixture. If necessary, compound (1) can be purified by an ordinary method such as distillation, chromatography or recrystallization. Alternatively, it may be possible to omit the aqueous work-up, either by filtering off the salt that has formed in the reaction, or by furnishing the reaction mixture directly to purification.

Resist Composition

As previously described, the nitrogen-containing organic compound of formula (1) is effective as a basic compound component to be formulated in a chemically amplified resist composition. The chemically amplified resist composition may be either positive or negative working. The chemically amplified resist composition of the invention is defined as comprising (A) the nitrogen-containing organic compound of formula (1),
(B) an organic solvent,
(C) a base resin, and
(D) a photoacid generator.

In one embodiment wherein the resist composition is positive, component (C) is a base resin having an acid labile group-protected acidic functional group, which is alkali-insoluble or substantially alkali-insoluble, but becomes alkali-soluble when the acid labile group is eliminated. In another embodiment wherein the resist composition is negative, the composition further includes a crosslinking agent (E), and component (C) is a base resin which is alkali-soluble, but becomes substantially alkali-insoluble when crosslinked with the crosslinking agent (E).

These components are described in detail.

Organic Solvent B

The organic solvent used herein may be any organic solvent in which the base resin, photoacid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the photoacid generator is most soluble therein.

An appropriate amount of the organic solvent used is about 200 to 1,000 parts, especially about 400 to 800 parts by weight per 100 parts by weight of the base resin.

Base Polymer C

The base polymers used as component (C) in the inventive compositions include polyhydroxystyrene (PHS), and lo copolymers of hydroxystyrene with styrene, (meth)acrylic acid esters or other polymerizable olefinic compounds, for KrF excimer laser resist use; (meth)acrylic acid ester polymers, alternating copolymers of cycloolefin with maleic anhydride, copolymers containing vinyl ethers or (meth)acrylic acid esters, polynorbornene, and ring-opening metathesis polymerized cycloolefins, for ArF excimer laser resist use; and fluorinated forms of the foregoing polymers (for both KrF and ArF laser uses) and polymers resulting from ring-closure polymerization using fluorinated dienes for $F_2$ excimer laser resist use. Silicon-substituted forms of the foregoing polymers and polysilsesquioxane polymers are useful for the bilayer resists. The base resin is not limited to the polymers of these systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile groups to be introduced into the base polymers may be selected from a variety of such groups, preferably from acetal groups of 2 to 30 carbon atoms and tertiary alkyl groups of 4 to 30 carbon atoms having the formulae (C1) and (C2), respectively.

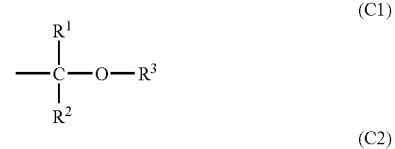

In formulae (C1) and (C2), $R^1$ and $R^2$ each are hydrogen or a straight, branched or cyclic alkyl group of 1 to 20 carbon atoms, which may contain a hetero atom such as oxygen, sulfur, nitrogen or fluorine, $R^3$, $R^4$, $R^5$ and $R^6$ each are a straight, branched or cyclic alkyl group of 1 to 20 carbon atoms, an aryl group or an aralkyl group, which may contain a hetero atom such as oxygen, sulfur, nitrogen or fluorine. A pair of $R^1$ and $R^2$, a pair of $R^1$ and $R^3$, a pair of $R^2$ and $R^3$, a pair of $R^4$ and $R^5$, a pair of $R^4$ and $R^6$, or a pair of $R^5$ and $R^6$, taken together, may form a ring of 3 to 20 carbon atoms with the carbon atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.02,6]decyl, 8-ethyl-8-tricyclo[5.2.1.02,6]decyl, 3-methyl-3-tetracyclo[4.4.0.12,5.17,10]dodecyl, 3-ethyl-3-tetracyclo[4.4.0.12,5.17,10]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydrogen atoms of hydroxyl groups may be substituted with acid labile groups of the following general formula (C3a) or (C3b) for crosslinkage between molecules or within a molecule.

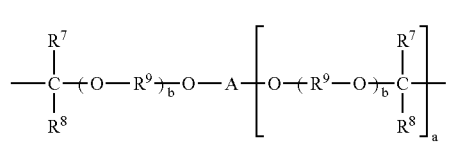

(C3a)

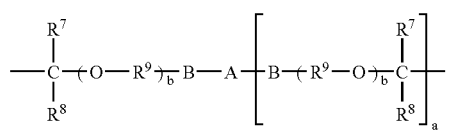

(C3b)

Herein, $R^7$ and $R^8$ each are hydrogen or a straight, branched or cyclic alkyl group of 1 to 8 carbon atoms, or $R^7$ and $R^8$, taken together, may form a ring, with the proviso that each of $R^7$ and $R^8$ is a straight or branched alkylene group of 1 to 8 carbon atoms when they form a ring. $R^9$ is a straight, branched or cyclic alkylene group of 1 to 10 carbon atoms. Letter "a" is an integer of 1 to 7, preferably 1 to 3, and "b" is 0 or an integer of 1 to 10. "A" is a (a+1)-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto.

(C3)-1

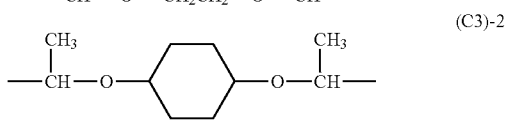

(C3)-2

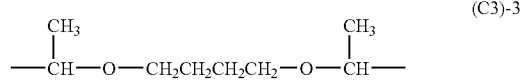

(C3)-3

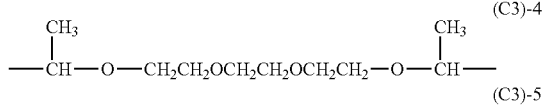

(C3)-4

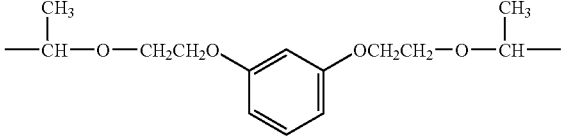

(C3)-5

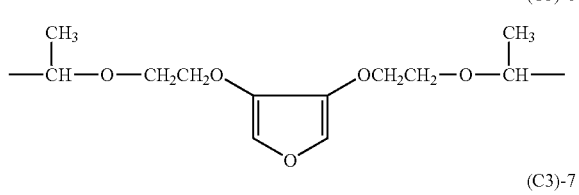

(C3)-6

(C3)-7

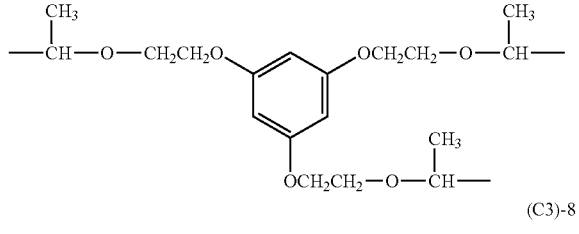

(C3)-8

Preferably the base polymer has a weight average molecular weight (Mw) of 2,000 to 100,000. With Mw below 2,000, film formation and resolution may become poor. With Mw beyond 100,000, resolution may become poor or foreign matter may generate during pattern formation. Note that the Mw is determined by gel permeation chromatography (GPC) using polystyrene standards.

Photoacid Generator D

The resist composition further contains (D) a compound capable of generating an acid upon exposure to high energy radiation, that is, a photoacid generator. Suitable photoacid generators include sulfonium salts, iodonium salts, sulfonyldiazomethane and N-sulfonyloxyimide photoacid generators. Exemplary photoacid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide structures with sulfonates. Exemplary imide structures are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime, bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example,
2,2,2-trifluoro-1-phenyl-ethanone oxime-O-methylsulfonate;
2,2,2-trifluoro-1-phenyl-ethanone oxime-O-(10-camphorylsulfonate);
2,2,2-trifluoro-1-phenyl-ethanone oxime-O-(4-methoxyphenyl-sulfonate);
2,2,2-trifluoro-1-phenyl-ethanone oxime-O-(1-naphthylsulfonate);
2,2,2-trifluoro-1-phenyl-ethanone oxime-O-(2-naphthylsulfonate);
2,2,2-trifluoro-1-phenyl-ethanone oxime-O-(2,4,6-trimethyl-phenylsulfonate);
2,2,2-trifluoro-1-(4-methylphenyl)-ethanone oxime-O-(10-camphorylsulfonate);
2,2,2-trifluoro-1-(4-methylphenyl)-ethanone oxime-O-(methyl-sulfonate);
2,2,2-trifluoro-1-(2-methylphenyl)-ethanone oxime-O-(10-camphorylsulfonate);
2,2,2-trifluoro-1-(2,4-dimethylphenyl)-ethanone oxime-O-(10-camphorylsulfonate);
2,2,2-trifluoro-1-(2,4-dimethylphenyl)-ethanone oxime-O-(1-naphthylsulfonate);
2,2,2-trifluoro-1-(2,4-dimethylphenyl)-ethanone oxime-O-(2-naphthylsulfonate);
2,2,2-trifluoro-1-(2,4,6-trimethylphenyl)-ethanone oxime-O-(10-camphorylsulfonate);
2,2,2-trifluoro-1-(2,4,6-trimethylphenyl)-ethanone oxime-O-(1-naphthylsulfonate);
2,2,2-trifluoro-1-(2,4,6-trimethylphenyl)-ethanone oxime-O-(2-naphthylsulfonate);
2,2,2-trifluoro-1-(4-methoxyphenyl)-ethanone oxime-O-methyl-sulfonate;
2,2,2-trifluoro-1-(4-methylthiophenyl)-ethanone oxime-O-methylsulfonate;
2,2,2-trifluoro-1-(3,4-dimethoxyphenyl)-ethanone oxime-O-methylsulfonate;
2,2,3,3,4,4,4-heptafluoro-1-phenyl-butanone oxime-O-(10-camphorylsulfonate);
2,2,2-trifluoro-1-(phenyl)-ethanone oxime-O-methylsulfonate;
2,2,2-trifluoro-1-(phenyl)-ethanone oxime-O-10-camphoryl-sulfonate;
2,2,2-trifluoro-1-(phenyl)-ethanone oxime-O-(4-methoxyphenyl)sulfonate;
2,2,2-trifluoro-1-(phenyl)-ethanone oxime-O-(1-naphthyl)sulfonate;
2,2,2-trifluoro-1-(phenyl)-ethanone oxime-O-(2-naphthyl)sulfonate;
2,2,2-trifluoro-1-(phenyl)-ethanone oxime-O-(2,4,6-trimethyl-phenyl)sulfonate;
2,2,2-trifluoro-1-(4-methylphenyl)-ethanone oxime-O-(10-camphoryl)sulfonate;
2,2,2-trifluoro-1-(4-methylphenyl)-ethanone oxime-O-methyl-sulfonate;
2,2,2-trifluoro-1-(2-methylphenyl)-ethanone oxime-O-(10-camphoryl)sulfonate;
2,2,2-trifluoro-1-(2,4-dimethylphenyl)-ethanone oxime-O-(1-naphthyl)sulfonate;
2,2,2-trifluoro-1-(2,4-dimethylphenyl)-ethanone oxime-O-(2-naphthyl)sulfonate;
2,2,2-trifluoro-1-(2,4,6-trimethylphenyl)-ethanone oxime-O-(10-camphoryl)sulfonate;
2,2,2-trifluoro-1-(2,4,6-trimethylphenyl)-ethanone oxime-O-(1-naphthyl)sulfonate;
2,2,2-trifluoro-1-(2,4,6-trimethylphenyl)-ethanone oxime-O-(2-naphthyl)sulfonate;
2,2,2-trifluoro-1-(4-methoxyphenyl)-ethanone oxime-O-methylsulfonate;
2,2,2-trifluoro-1-(4-thiomethylphenyl)-ethanone oxime-O-methylsulfonate;
2,2,2-trifluoro-1-(3,4-dimethoxyphenyl)-ethanone oxime-O-methylsulfonate;
2,2,2-trifluoro-1-(4-methoxyphenyl)-ethanone oxime-O-(4-methylphenyl)sulfonate;
2,2,2-trifluoro-1-(4-methoxyphenyl)-ethanone oxime-O-(4-methoxyphenyl)sulfonate;
2,2,2-trifluoro-1-(4-methoxyphenyl)-ethanone oxime-O-(4-dodecylphenyl)sulfonate;
2,2,2-trifluoro-1-(4-methoxyphenyl)-ethanone oxime-O-octylsulfonate;
2,2,2-trifluoro-1-(4-thiomethylphenyl)-ethanone oxime-O-(4-methoxyphenyl)sulfonate;
2,2,2-trifluoro-1-(4-thiomethylphenyl)-ethanone oxime-O-(4-dodecylphenyl)sulfonate;
2,2,2-trifluoro-1-(4-thiomethylphenyl)-ethanone oxime-O-octylsulfonate;
2,2,2-trifluoro-1-(4-thiomethylphenyl)-ethanone oxime-O-(2-naphthyl)sulfonate;
2,2,2-trifluoro-1-(2-methylphenyl)-ethanone oxime-O-methylsulfonate;
2,2,2-trifluoro-1-(4-methylphenyl)-ethanone oxime-O-phenylsulfonate;
2,2,2-trifluoro-1-(4-chlorophenyl)-ethanone oxime-O-phenylsulfonate;
2,2,3,3,4,4,4-heptafluoro-1-(phenyl)-butanone oxime-O-(10-camphoryl)sulfonate;
2,2,2-trifluoro-1-naphthyl-ethanone oxime-O-methylsulfonate;

2,2,2-trifluoro-2-naphthyl-ethanone oxime-O-methylsulfonate;
2,2,2-trifluoro-1-[4-benzylphenyl]-ethanone oxime-O-methyl-sulfonate;
2,2,2-trifluoro-1-[4-(phenyl-1,4-dioxa-but-1-yl)phenyl]-ethanone oxime-O-methylsulfonate;
2,2,2-trifluoro-1-naphthyl-ethanone oxime-O-propylsulfonate;
2,2,2-trifluoro-2-naphthyl-ethanone oxime-O-propylsulfonate;
2,2,2-trifluoro-1-[4-benzylphenyl]-ethanone oxime-O-propyl-sulfonate;
2,2,2-trifluoro-1-[4-methylsulfonylphenyl]-ethanone oxime-O-propylsulfonate;
1,3-bis[1-(4-phenoxyphenyl)-2,2,2-trifluoroethanone oxime-O-sulfonyl]phenyl;
2,2,2-trifluoro-1-[4-methylsulfonyloxyphenyl]-ethanone oxime-O-propylsulfonate;
2,2,2-trifluoro-1-[4-methylcarbonyloxyphenyl]-ethanone oxime-O-propylsulfonate;
2,2,2-trifluoro-1-[6H,7H-5,8-dioxonaphth-2-yl]-ethanone oxime-O-propylsulfonate;
2,2,2-trifluoro-1-[4-methoxycarbonylmethoxyphenyl]-ethanone oxime-O-propylsulfonate;
2,2,2-trifluoro-1-[4-(methoxycarbonyl)-(4-amino-1-oxa-pent-1-yl)-phenyl]-ethanone oxime-O-propylsulfonate;
2,2,2-trifluoro-1-[3,5-dimethyl-4-ethoxyphenyl]-ethanone oxime-O-propylsulfonate;
2,2,2-trifluoro-1-[4-benzyloxyphenyl]-ethanone oxime-O-propylsulfonate;
2,2,2-trifluoro-1-[2-thiophenyl]-ethanone oxime-O-propylsulfonate; and
2,2,2-trifluoro-1-[1-dioxa-thiophen-2-yl)]-ethanone oxime-O-propylsulfonate.

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]-acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylene-diacetonitrile, etc.

Of these, preferred photoacid generators are sulfonium salts, bissulfonyldiazomethanes, N-sulfonyloxyimides and glyoxime derivatives. More preferred photoacid generators are sulfonium salts, bissulfonyldiazomethanes, and N-sulfonyloxyimides. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluene-sulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the chemically amplified resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid-propagating compound. For these compounds, reference should be made to J. Photopolym. Sci. and Tech., 8, 43-44, 45-46 (1995), and ibid., 9, 29-30 (1996).

Examples of the acid-propagating compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid-propagating compound-like behavior.

In the resist composition, an appropriate amount of the acid-propagating compound is up to 2 parts, and especially up to 1 part by weight per 100 parts by weight of the base resin. Excessive amounts of the acid-propagating compound make diffusion control difficult, leading to degradation of resolution and pattern configuration.

Crosslinker E

Formulated in the negative resist composition is a crosslinker (E) which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl) melamine compounds are suitable as the crosslinker. Examples include N,N,N',N'-tetramethoxymethylurea, hexamethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethylbisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is, though not limited thereto, about 1 to 25 parts, and especially about 5 to 20 parts by weight per 100 parts by weight of the base resin. The crosslinkers may be used alone or in admixture of two or more.

In addition to the inventive nitrogen-containing organic compound, one or more of commonly used basic compounds may be employed in the inventive resist composition.

In addition to the above components, the inventive resist composition may optionally include known additives such as dissolution inhibitors, surfactants, acidic compounds, dyes, thermal crosslinkers and stabilizers.

In the inventive resist composition, an appropriate amount of the nitrogen-containing organic compound of formula (1) compounded is 0.001 to 2 parts by weight, desirably 0.01 to 1 parts by weight per 100 parts by weight of the base resin. Less than 0.001 pbw of the nitrogen-containing compound may fail to achieve the desired effect whereas more than 2 pbw may lower the sensitivity of the resist.

Pattern formation using the resist composition of the invention may be carried out by a known lithographic technique. For example, the resist composition may be applied onto a substrate such as a silicon wafer by spin coating or the like to form a resist film having a thickness of 0.05 to 2.0 μm, which is then pre-baked on a hot plate at 60 to 150° C. for 0.1 to 10 minutes, and preferably at 80 to 140° C. for 0.5 to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$. Light exposure may be carried out by a conventional exposure process or in some cases, by an immersion process of filling the space between the mask and the resist with liquid. The resist film is then post-exposure baked (PEB) on a hot plate at 60 to 150° C. for 0.1 to 5 minutes, and preferably at 80 to 140° C. for 0.5 to 3 minutes. Finally, development may be carried out using as the developer an aqueous alkali solution, such as 0.1 to 5 wt %, and preferably 2 to 3 wt %, tetramethylammonium hydroxide (TMAH), this being carried out by a conventional method such as dipping, puddling, or spraying for a period of 0.1 to 3 minutes, and preferably 0.5 to 2 minutes. These steps result in the formation of the desired pattern on the substrate. If necessary, the pattern as developed can be heat treated for adjusting the pattern size (known as the thermal flow process).

Of the various types of high-energy radiation that may be used, the resist composition of the invention is best suited to micro-pattern formation with, in particular, deep-UV rays having a wavelength of 250 to 120 nm or excimer laser beams, extremely short UV, x-rays or electron beams.

EXAMPLE

Examples of the invention are given below by way of illustration and not by way of limitation.

SYNTHESIS EXAMPLES

Nitrogen-containing organic compounds within the scope of the invention were synthesized by the method described below.

Synthesis Example 1

Synthesis of 1-(2-methoxyethyl)-1H-benzimidazole (Amine 1)

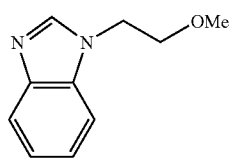

Amine 1

In a nitrogen atmosphere, a mixture of 118 g of benzimidazole, 94.5 g of 2-chloroethyl methyl ether, 138 g of potassium carbonate, and 400 g of N,N-dimethylformamide was heated and stirred at 100° C. for 20 hours. The reaction mixture was subjected to conventional aqueous work-up and distillation under reduced pressure for purification, to give 154 g of 1-(2-methoxyethyl)-1H-benzimidazole (boiling point 125° C./33 Pa, yield 87%).

IR (thin film): ν=3085, 3054, 2983, 2929, 2890, 2831, 1616, 1496, 1457, 1361, 1332, 1288, 1276, 1251, 1214, 1199, 1180, 1151, 1118, 1066, 1014, 968, 931, 887, 835, 767, 744, 705, 632 cm$^{-1}$ $^1$H-NMR (600 MHz in CDCl$_3$): δ=3.29 (3H, s), 3.69 (2H, t, J=5.2 Hz), 4.29 (2H, t, J=5.2 Hz), 7.27 (1H, dt, J=1.4, 7.2 Hz), 7.29 (1H, dt, J=1.7, 7.2 Hz), 7.38 (1H, m), 7.80 (1H, m), 7.95 (1H, br. s)

Synthesis Example 2

Synthesis of 1-(2-methoxyethyl)-2-methyl-1H-benzimidazole (Amine 2)

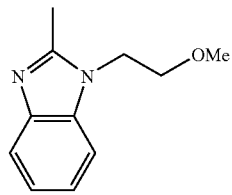

Amine 2

1-(2-Methoxyethyl)-2-methyl-1H-benzimidazole was synthesized as in Synthesis Example 1 except that an equimolar amount of 2-methylbenzimidazole was used instead of benzimidazole. Yield 79%.

Synthesis Example 3

Synthesis of 2-ethyl-1-(2-methoxyethyl)-1H-benzimidazole (Amine 3)

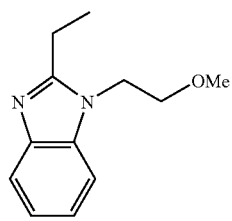

Amine 3

2-Ethyl-1-(2-methoxyethyl)-1H-benzimidazole was synthesized as in Synthesis Example 1 except that an equimolar amount of 2-ethylbenzimidazole was used instead of benzimidazole. Yield 78%.

Synthesis Example 4

Synthesis of 1-(2-methoxyethyl)-2-phenyl-1H-benzimidazole (Amine 4)

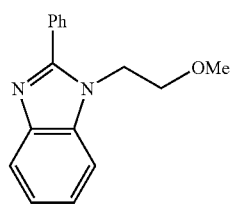

Amine 4

1-(2-Methoxyethyl)-2-phenyl-1H-benzimidazole was synthesized as in Synthesis Example 1 except that an equimolar amount of 2-phenylbenzimidazole was used instead of benzimidazole and purification was carried out by column chromatography. Yield 70%.

Synthesis Example 5

Synthesis of 1-(2-ethoxyethyl)-1H-benzimidazole (Amine 5)

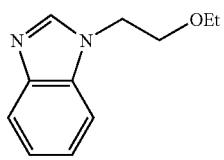

Amine 5

1-(2-Ethoxyethyl)-1H-benzimidazole was synthesized as in Synthesis Example 1 except that an equimolar amount of 2-chloroethyl ethyl ether was used instead of 2-chloroethyl methyl ether. Yield 90%.

Synthesis Example 6

Synthesis of 1-(2-ethoxyethyl)-2-methyl-1H-benzimidazole (Amine 6)

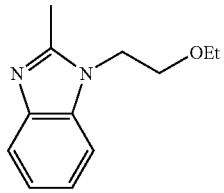

Amine 6

1-(2-Ethoxyethyl)-2-methyl-1H-benzimidazole was synthesized as in Synthesis Example 1 except that an equimolar amount of 2-methylbenzimidazole was used instead of benzimidazole, and an equimolar amount of 2-chloroethyl ethyl ether was used instead of 2-chloroethyl methyl ether. Yield 82%.

Synthesis Example 7

Synthesis of 1-(2-ethoxyethyl)-2-ethyl-1H-benzimidazole (Amine 7)

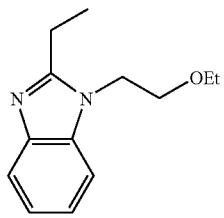

Amine 7

1-(2-Ethoxyethyl)-2-ethyl-1H-benzimidazole was synthesized as in Synthesis Example 1 except that an equimolar amount of 2-ethylbenzimidazole was used instead of benzimidazole, and an equimolar amount of 2-chloroethyl ethyl ether was used instead of 2-chloroethyl methyl ether. Yield 80%.

Synthesis Example 8

Synthesis of 1-(2-ethoxyethyl)-2-phenyl-1H-benzimidazole (Amine 8)

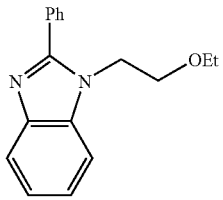

Amine 8

1-(2-Ethoxyethyl)-2-phenyl-1H-benzimidazole was synthesized as in Synthesis Example 1 except that an equimolar amount of 2-phenylbenzimidazole was used instead of benzimidazole, an equimolar amount of 2-chloroethyl ethyl ether was used instead of 2-chloroethyl methyl ether, and purification was carried out by column chromatography. Yield 72%.

Synthesis Example 9

Synthesis of 1-(2-propoxyethyl)-1H-benzimidazole (Amine 9)

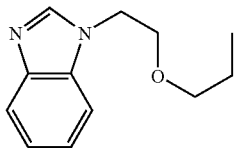

Amine 9

1-(2-Propoxyethyl)-1H-benzimidazole was synthesized as in Synthesis Example 1 except that an equimolar amount of 2-chloroethyl propyl ether was used instead of 2-chloroethyl methyl ether. Yield 88%.

Synthesis Example 10

Synthesis of 1-(2-isopropoxyethyl)-1H-benzimidazole (Amine 10)

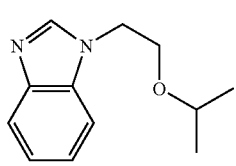

Amine 10

1-(2-Isopropoxyethyl)-1H-benzimidazole was synthesized as in Synthesis Example 1 except that an equimolar amount of 2-chloroethyl isopropyl ether was used instead of 2-chloroethyl methyl ether. Yield 87%.

Synthesis Example 11

Synthesis of 1-(2-t-butoxyethyl)-1H-benzimidazole (Amine 11)

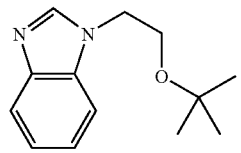

Amine 11

1-(2-t-Butoxyethyl)-1H-benzimidazole was synthesized as in Synthesis Example 1 except that an equimolar amount of 2-chloroethyl t-butyl ether was used instead of 2-chloroethyl methyl ether. Yield 83%.

Synthesis Example 12

Synthesis of 1-(2-cyclohexyloxyethyl)-1H-benzimidazole (Amine 12)

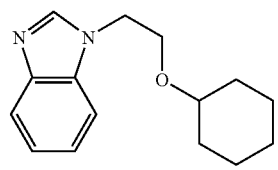

Amine 12

1-(2-Cyclohexyloxyethyl)-1H-benzimidazole was synthesized as in Synthesis Example 1 except that an equimolar amount of 2-chloroethyl cyclohexyl ether was used instead of 2-chloroethyl methyl ether. Yield 79%.

Synthesis Example 13

Synthesis of 1-[2-(2-methoxyethoxy)ethyl]-1H-benzimidazole (Amine 13)

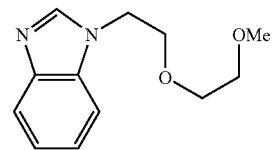

Amine 13

1-[2-(2-Methoxyethoxy)ethyl]-1H-benzimidazole was synthesized as in Synthesis Example 1 except that an equimolar amount of 2-chloroethyl 2-methoxyethyl ether was used instead of 2-chloroethyl methyl ether. Boiling point 149° C./16 Pa. Yield 76%.

IR (thin film): ν=3089, 3054, 2877, 2823, 1614, 1494, 1459, 1380, 1363, 1332, 1288, 1203, 1114, 1027, 1006, 929, 887, 848, 767, 746, 705, 632 cm$^{-1}$ $^1$H-NMR (600 MHz in CDCl$_3$): δ=3.32 (3H, s), 3.45 (2H, m), 3.53 (2H, m), 3.81 (2H, t, J=5.3 Hz), 4.33 (2H, t, J=5.3

Hz), 7.26 (1H, dt, J=1.0, 7.3 Hz), 7.28 (1H, dt, J=1.4, 7.3 Hz), 7.40 (1H, m), 7.79 (1H, m), 7.99 (1H, br. s)

Synthesis Example 14

Synthesis of 1-[2-(2-methoxyethoxy)ethyl]-2-methyl-1H-benzimidazole (Amine 14)

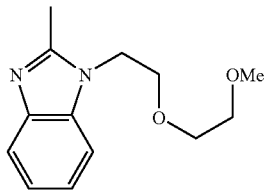

Amine 14

1-[2-(2-Methoxyethoxy)ethyl]-2-methyl-1H-benzimidazole was synthesized as in Synthesis Example 1 except that an equimolar amount of 2-methylbenzimidazole was used instead of benzimidazole and an equimolar amount of 2-chloroethyl 2-methoxyethyl ether was used instead of 2-chloroethyl methyl ether. Yield 78%.

Synthesis Example 15

Synthesis of 2-ethyl-1-[2-(2-methoxyethoxy)ethyl]-1H-benzimidazole (Amine 15)

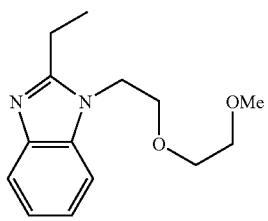

Amine 15

2-Ethyl-1-[2-(2-methoxyethoxy)ethyl]-1H-benzimidazole was synthesized as in Synthesis Example 1 except that an equimolar amount of 2-ethylbenzimidazole was used instead of benzimidazole and an equimolar amount of 2-chloroethyl 2-methoxyethyl ether was used instead of 2-chloroethyl methyl ether. Yield 77%.

Synthesis Example 16

Synthesis of 1-[2-(2-methoxyethoxy)ethyl]-2-phenyl-1H-benzimidazole (Amine 16)

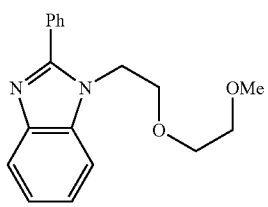

Amine 16

1-[2-(2-Methoxyethoxy)ethyl]-2-phenyl-1H-benzimidazole was synthesized as in Synthesis Example 1 except that an equimolar amount of 2-phenylbenzimidazole was used instead of benzimidazole, an equimolar amount of 2-chloroethyl 2-methoxyethyl ether was used instead of 2-chloroethyl methyl ether, and purification was effected by column chromatography. Yield 71%.

Synthesis Example 17

Synthesis of 1-[2-(2-ethoxyethoxy)ethyl]-1H-benzimidazole (Amine 17)

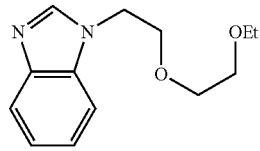

Amine 17

1-[2-(2-Ethoxyethoxy)ethyl]-1H-benzimidazole was synthesized as in Synthesis Example 1 except that an equimolar amount of 2-chloroethyl 2-ethoxyethyl ether was used instead of 2-chloroethyl methyl ether. Yield 87%.

Synthesis Example 18

Synthesis of 1-[2-(2-ethoxyethoxy)ethyl]-2-methyl-1H-benzimidazole (Amine 18)

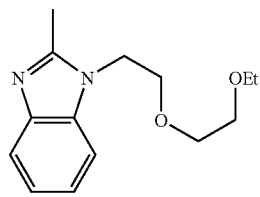

Amine 18

1-[2-(2-Ethoxyethoxy)ethyl]-2-methyl-1H-benzimidazole was synthesized as in Synthesis Example 1 except that an equimolar amount of 2-methylbenzimidazole was used instead of benzimidazole and an equimolar amount of 2-chloroethyl 2-ethoxyethyl ether was used instead of 2-chloroethyl methyl ether. Yield 84%.

Synthesis Example 19

Synthesis of 1-[2-[2-(2-methoxyethoxy)ethoxy]ethyl]-1H-benzimidazole (Amine 19)

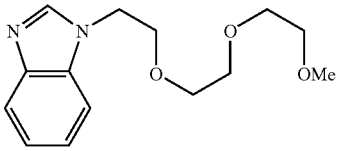

Amine 19

1-[2-[2-(2-Methoxyethoxy)ethoxy]ethyl]-1H-benzimidazole was synthesized as in Synthesis Example 1 except that an equimolar amount of 2-chloroethyl 2-(2-methoxyethoxy)ethyl ether was used instead of 2-chloroethyl methyl ether. Boiling point 157° C./13 Pa. Yield 79%.

IR (thin film): ν=3091, 3054, 2875, 1614, 1496, 1459, 1363, 1332, 1288, 1253, 1203, 1108, 1027, 1006, 931, 887, 850, 769, 746, 705, 634 cm$^{-1}$ $^1$H-NMR (600 MHz in CDCl$_3$): δ=3.34 (3H, s), 3.45-3.47 (2H, m), 3.52-3.54 (2H, m), 3.54-3.57 (4H, m), 3.81 (2H, t, J=5.3 Hz), 4.32 (2H, t, J=5.3 Hz), 7.25 (1H, dt, J=1.4, 7.2 Hz), 7.28 (1H, dt, J=1.4, 7.2 Hz), 7.39 (1H, m), 7.79 (1H, m), 7.99 (1H, br. s)

Synthesis Example 20

Synthesis of 1-[2-[2-(2-methoxyethoxy)ethoxy]ethyl]-2-methyl-1H-benzimidazole (Amine 20)

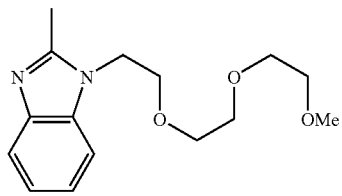

Amine 20

1-[2-[2-(2-Methoxyethoxy)ethoxy]ethyl]-2-methyl-1H-benzimidazole was synthesized as in Synthesis Example 1 except that an equimolar amount of 2-methylbenzimidazole was used instead of benzimidazole and an equimolar amount of 2-chloroethyl 2-(2-methoxyethoxy)ethyl ether was used instead of 2-chloroethyl methyl ether. Yield 82%.

Synthesis Example 21

Synthesis of 1-[2-[2-[2-(2-methoxyethoxy)ethoxy]ethoxy]-ethyl]-1H-benzimidazole (Amine 21)

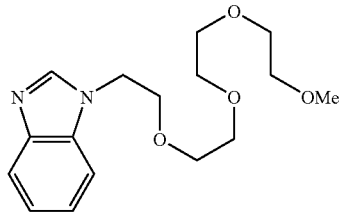

Amine 21

1-[2-[2-[2-(2-Methoxyethoxy)ethoxy]ethoxy]ethyl]-1H-benzimidazole was synthesized as in Synthesis Example 1 except that an equimolar amount of 2-chloroethyl 2-[2-(2-methoxyethoxy)ethoxy]ethyl ether was used instead of 2-chloroethyl methyl ether. Yield 68%.

Synthesis Example 22

Synthesis of 1-[2-[2-[2-[2-(2-methoxyethoxy)ethoxy]ethoxy]-ethoxy]ethyl]-2-methyl-1H-benzimidazole (Amine 22)

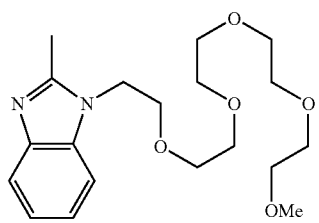

Amine 22

1-[2-[2-[2-[2-(2-Methoxyethoxy)ethoxy]ethoxy]ethoxy]-ethyl]-2-methyl-1H-benzimidazole was synthesized as in Synthesis Example 1 except that an equimolar amount of 2-methylbenzimidazole was used instead of benzimidazole, an equimolar amount of 2-chloroethyl 2-[2-[2-(2-methoxyethoxy)-ethoxy]ethoxy]ethyl ether was used instead of 2-chloroethyl methyl ether, and purification was effected by column chromatography. Yield 63%.

Synthesis Example 23

Synthesis of 1-[2-[2-[2-[2-[2-(2-methoxyethoxy)ethoxy]ethoxy]-ethoxy]ethoxy]ethyl]-2-methyl-1H-benzimidazole (Amine 23)

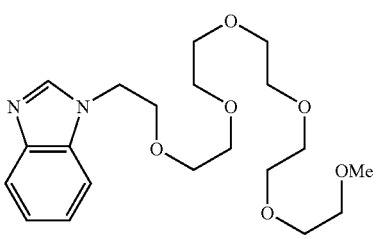

Amine 23

1-[2-[2-[2-[2-[2-(2-Methoxyethoxy)ethoxy]ethoxy]-ethoxy]ethoxy]ethyl]-2-methyl-1H-benzimidazole was synthesized as in Synthesis Example 1 except that an equimolar amount of 2-chloroethyl 2-[2-[2-[2-(2-methoxy-ethoxy)ethoxy]ethoxy]ethoxy]ethyl ether was used instead of 2-chloroethyl methyl ether, and purification was effected by column chromatography. Yield 59%.

Synthesis Example 24

Synthesis of 1-(2-cyclohexyloxyethoxy)-2-phenyl-1H-benzimidazole (Amine 24)

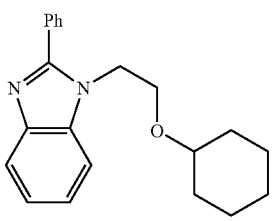

Amine 24

1-(2-Cyclohexyloxyethoxy)-2-phenyl-1H-benzimidazole was synthesized as in Synthesis Example 1 except that an equimolar amount of 2-phenylbenzimidazole was used instead of benzimidazole, an equimolar amount of 2-chloroethyl cyclohexyl ether was used instead of 2-chloroethyl methyl ether, and purification was effected by column chromatography. Yield 72%.

EXAMPLES

Resist compositions were prepared using nitrogen-containing organic compounds of the invention and evaluated for resolution, pattern profile and sidewall roughness by carrying out the patterning process of the invention. Note that PGMEA is propylene glycol monomethyl ether acetate.

Example 1

A resist composition was prepared by using the nitrogen-containing organic compound (Amine 1) obtained in Synthesis Example 1, combining it with other components in accordance with the following recipe, and filtering the resulting solution through a Teflon® filter having a pore diameter of 0.2 μm.

| Components | Parts by weight |
| --- | --- |
| (A) base polymer (Polymer 3) | 100 |
| (B) photoacid generator (PAG5) | 2.0 |
| (C) Solvent | |
| PGMEA | 280 |
| Ethyl lactate | 120 |
| (D) N-containing compound (Amine 1) | 0.1 |

The resulting resist solution was spin-coated onto a silicon wafer substrate having an antireflective coating (DUV-30 by Nissan Chemical Industries, Ltd., 55 nm) coated thereon, then baked at 100° C. for 90 seconds, forming a resist film having a thickness of 550 nm. The resist film was exposed using an excimer laser stepper NSR-S203B (by Nikon Corporation; NA=0.68; σ=0.75; ⅔ annular illumination), then heat treated at 110° C. for 90 seconds, cooled to 23° C., and subjected to puddle development with a 2.38 wt % aqueous solution of tetramethylammonium hydroxide at 23° C. for 60. seconds, forming a 1:1 line-and-space pattern. The wafer as developed was observed under a top-down SEM. At the optimum exposure dose which provided a 1:1 resolution of a 0.18 μm line-and-space pattern, a 0.15 μm line-and-space pattern was separately resolved without peeling. A cross section of the resist pattern was also observed to find that the pattern profile was rectangular and perpendicular to the substrate. Little roughness of pattern sidewalls was observable.

Examples 2-33 and Comparative Examples 1-14

Resist compositions were prepared as in Example 1 using the nitrogen-containing organic compounds (Amines 2 to 24) obtained in Synthesis Examples 2 to 24 and comparative nitrogen-containing organic compounds. The resist compositions were evaluated for resolution, pattern profile and sidewall roughness.

Based on the results of these tests, the resolution of the 0.15 μm line-and-space pattern and sidewall roughness are classified into ratings of passed (○), mediocre (Δ) and rejected (X) as tabulated in Table 1 (Examples) and Table 2 (Comparative Examples), with the pattern profile observed being reported together.

TABLE 1

| Example | Polymer | Photoacid generator | N-containing compound | Dissolution inhibitor/ Crosslinker (pbw) | 0.15 μm resolution | Pattern profile | Sidewalls |
| --- | --- | --- | --- | --- | --- | --- | --- |
| 1 | Polymer 3 | PAG 5 | Amine 1 | — | ○ | rectangular, perpendicular | ○ |
| 2 | Polymer 3 | PAG 5 | Amine 2 | — | ○ | rectangular, perpendicular | ○ |
| 3 | Polymer 3 | PAG 5 | Amine 3 | — | ○ | rectangular, perpendicular | ○ |
| 4 | Polymer 3 | PAG 5 | Amine 4 | — | ○ | rectangular, perpendicular | ○ |
| 5 | Polymer 3 | PAG 5 | Amine 5 | — | ○ | rectangular, perpendicular | ○ |
| 6 | Polymer 3 | PAG 5 | Amine 6 | — | ○ | rectangular, perpendicular | ○ |
| 7 | Polymer 3 | PAG 5 | Amine 7 | — | ○ | rectangular, perpendicular | ○ |
| 8 | Polymer 3 | PAG 5 | Amine 8 | — | ○ | rectangular, perpendicular | ○ |
| 9 | Polymer 3 | PAG 5 | Amine 9 | — | ○ | rectangular, perpendicular | ○ |
| 10 | Polymer 3 | PAG 5 | Amine 10 | — | ○ | rectangular, perpendicular | ○ |
| 11 | Polymer 3 | PAG 5 | Amine 11 | — | ○ | rectangular, perpendicular | ○ |
| 12 | Polymer 3 | PAG 5 | Amine 12 | — | ○ | rectangular, perpendicular | ○ |
| 13 | Polymer 3 | PAG 5 | Amine 13 | — | ○ | rectangular, perpendicular | ○ |
| 14 | Polymer 3 | PAG 5 | Amine 14 | — | ○ | rectangular, perpendicular | ○ |
| 15 | Polymer 3 | PAG 5 | Amine 15 | — | ○ | rectangular, perpendicular | ○ |
| 16 | Polymer 3 | PAG 5 | Amine 16 | — | ○ | rectangular, perpendicular | ○ |
| 17 | Polymer 3 | PAG 5 | Amine 17 | — | ○ | rectangular, perpendicular | ○ |
| 18 | Polymer 3 | PAG 5 | Amine 18 | — | ○ | rectangular, perpendicular | ○ |
| 19 | Polymer 3 | PAG 5 | Amine 19 | — | ○ | rectangular, perpendicular | ○ |
| 20 | Polymer 3 | PAG 5 | Amine 20 | — | ○ | rectangular, perpendicular | ○ |

TABLE 1-continued

| Example | Polymer | Photoacid generator | N-containing compound | Dissolution inhibitor/ Crosslinker (pbw) | 0.15 μm resolution | Pattern profile | Sidewalls |
|---|---|---|---|---|---|---|---|
| 21 | Polymer 3 | PAG 5 | Amine 21 | — | ○ | rectangular, perpendicular | ○ |
| 22 | Polymer 3 | PAG 5 | Amine 22 | — | ○ | rectangular, perpendicular | ○ |
| 23 | Polymer 3 | PAG 5 | Amine 23 | — | ○ | rectangular, perpendicular | ○ |
| 24 | Polymer 3 | PAG 5 | Amine 24 | — | ○ | rectangular, perpendicular | ○ |
| 25 | Polymer 1 | PAG 5 | Amine 13 | — | ○ | rectangular, perpendicular | ○ |
| 26 | Polymer 2 | PAG 5 | Amine 13 | — | ○ | rectangular, perpendicular | ○ |
| 27 | Polymer 3 | PAG 4 | Amine 13 | — | ○ | rectangular, perpendicular | ○ |
| 28 | Polymer 4 | PAG 2 | Amine 13 | Crosslinker (15) | ○ | rectangular, perpendicular | ○ |
| 29 | Polymer 5 | PAG 3 | Amine 13 | — | ○ | rectangular, perpendicular | ○ |
| 30 | Polymer 5 | PAG 2 | Amine 13 | DRI (15) | ○ | rectangular, perpendicular | ○ |
| 31 | Polymer 6 | PAG 1 | Amine 13 | — | ○ | rectangular, perpendicular | ○ |
| 32 | Polymer 7 | PAG 4 | Amine 13 | — | ○ | rectangular, perpendicular | ○ |
| 33 | Polymer 8 | PAG 1 | Amine 13 | — | ○ | rectangular, perpendicular | ○ |

TABLE 2

| Comparative Example | Polymer | Photoacid generator | N-containing compound/ Dissolution inhibitor, Crosslinker (pbw) | 0.15 μm resolution | Pattern profile | Sidewalls |
|---|---|---|---|---|---|---|
| 1 | Polymer 3 | PAG 5 | trioctylamine | X | — | — |
| 2 | Polymer 3 | PAG 5 | 1,8-diazabicyclo[5.4.0]-7-undecene | X | — | — |
| 3 | Polymer 3 | PAG 5 | triethanolamine | ○ | rounded top, tapered | X |
| 4 | Polymer 3 | PAG 5 | tris(2-methoxyethyl)amine | Δ | rounded top, tapered | X |
| 5 | Polymer 3 | PAG 5 | 2-phenylbenzimidazole | ○ | rounded top, tapered | Δ |
| 6 | Polymer 1 | PAG 5 | triethanolamine | ○ | rounded top, tapered | X |
| 7 | Polymer 2 | PAG 5 | triethanolamine | X | — | — |
| 8 | Polymer 3 | PAG 4 | triethanolamine | ○ | rounded top, tapered | X |
| 9 | Polymer 4 | PAG 2 | triethanolamine/Crosslinker (15) | X | — | — |
| 10 | Polymer 5 | PAG 3 | triethanolamine | ○ | rounded top, tapered | X |
| 11 | Polymer 5 | PAG 2 | triethanolamine/DRI (15) | ○ | rounded top, tapered | X |
| 12 | Polymer 6 | PAG 1 | triethanolamine | Δ | rounded top, tapered | X |
| 13 | Polymer 7 | PAG 4 | triethanolamine | ○ | rounded top, tapered | X |
| 14 | Polymer 8 | PAG 1 | triethanolamine | X | — | — |

Example 34

A resist composition was prepared by using the nitrogen-containing organic compound (Amine 1) obtained in Synthesis Example 1, combining it with other components in accordance with the following recipe, and filtering the resulting solution through a Teflon® filter having a pore diameter of 0.2 μm.

| Components | Parts by weight |
|---|---|
| (A) base polymer (Polymer 11) | 80 |
| (B) photoacid generator (PAG1) | 2.0 |
| (C) Solvent (PGMEA) | 640 |
| (D) N-containing compound (Amine 1) | 0.25 |

The resulting resist solution was spin-coated onto a silicon wafer substrate having an antireflective coating (ARC29A by Nissan Chemical Industries, Ltd., 78 nm) coated thereon, then baked at 130° C. for 60 seconds, forming a resist film having a thickness of 300 nm. The resist film was exposed using an ArF excimer laser stepper (by Nikon Corporation; NA=0.68), then heat treated at 115° C. for 60 seconds, cooled to 23° C., and subjected to puddle development with a 2.38 wt % aqueous solution of tetramethylammonium hydroxide at 23° C. for 60 seconds, forming a 1:1 line-and-space pattern. The wafer as developed was observed under a top-down SEM. At the optimum exposure dose which provided a 1:1 resolution of a 0.15 μm line-and-space pattern, a 0.13 μm line-and-space pattern was separately resolved without peeling. A cross section of the resist pattern was also observed to find that the pattern profile was rectangular and perpendicular to the substrate. Little roughness of pattern sidewalls was observable.

Examples 35-61 and Comparative Examples 15-23

Resist compositions were prepared as in Example 34 using the nitrogen-containing organic compounds (Amines 2 to 24) obtained in Synthesis Examples 2 to 24 and comparative nitrogen-containing organic compounds. The resist compositions were evaluated for resolution, pattern profile and sidewall roughness.

Based on the results of these tests, the resolution of the 0.13 μm line-and-space pattern and sidewall roughness are classified into ratings of passed (◯), mediocre (Δ) and rejected (X) as tabulated in Table 3 (Examples) and Table 4 (Comparative Examples), with the pattern profile observed being reported together.

TABLE 3

| Example | Polymer | Photoacid generator | N-containing compound | Dissolution inhibitor/ Crosslinker (pbw) | 0.13 μm resolution | Pattern profile | Sidewalls |
|---|---|---|---|---|---|---|---|
| 34 | Polymer 9 | PAG 1 | Amine 1 | — | ◯ | rectangular, perpendicular | ◯ |
| 35 | Polymer 9 | PAG 1 | Amine 2 | — | ◯ | rectangular, perpendicular | ◯ |
| 36 | Polymer 9 | PAG 1 | Amine 3 | — | ◯ | rectangular, perpendicular | ◯ |
| 37 | Polymer 9 | PAG 1 | Amine 4 | — | ◯ | rectangular, perpendicular | ◯ |
| 38 | Polymer 9 | PAG 1 | Amine 5 | — | ◯ | rectangular, perpendicular | ◯ |
| 39 | Polymer 9 | PAG 1 | Amine 6 | — | ◯ | rectangular, perpendicular | ◯ |
| 40 | Polymer 9 | PAG 1 | Amine 7 | — | ◯ | rectangular, perpendicular | ◯ |
| 41 | Polymer 9 | PAG 1 | Amine 8 | — | ◯ | rectangular, perpendicular | ◯ |
| 42 | Polymer 9 | PAG 1 | Amine 9 | — | ◯ | rectangular, perpendicular | ◯ |
| 43 | Polymer 9 | PAG 1 | Amine 10 | — | ◯ | rectangular, perpendicular | ◯ |
| 44 | Polymer 9 | PAG 1 | Amine 11 | — | ◯ | rectangular, perpendicular | ◯ |
| 45 | Polymer 9 | PAG 1 | Amine 12 | — | ◯ | rectangular, perpendicular | ◯ |
| 46 | Polymer 9 | PAG 1 | Amine 13 | — | ◯ | rectangular, perpendicular | ◯ |
| 47 | Polymer 9 | PAG 1 | Amine 14 | — | ◯ | rectangular, perpendicular | ◯ |
| 48 | Polymer 9 | PAG 1 | Amine 15 | — | ◯ | rectangular, perpendicular | ◯ |
| 49 | Polymer 9 | PAG 1 | Amine 16 | — | ◯ | rectangular, perpendicular | ◯ |
| 50 | Polymer 9 | PAG 1 | Amine 17 | — | ◯ | rectangular, perpendicular | ◯ |
| 51 | Polymer 9 | PAG 1 | Amine 18 | — | ◯ | rectangular, perpendicular | ◯ |
| 52 | Polymer 9 | PAG 1 | Amine 19 | — | ◯ | rectangular, perpendicular | ◯ |
| 53 | Polymer 9 | PAG 1 | Amine 20 | — | ◯ | rectangular, perpendicular | ◯ |
| 54 | Polymer 9 | PAG 1 | Amine 21 | — | ◯ | rectangular, perpendicular | ◯ |
| 55 | Polymer 9 | PAG 1 | Amine 22 | — | ◯ | rectangular, perpendicular | ◯ |
| 56 | Polymer 9 | PAG 1 | Amine 23 | — | ◯ | rectangular, perpendicular | ◯ |
| 57 | Polymer 9 | PAG 1 | Amine 24 | — | ◯ | rectangular, perpendicular | ◯ |
| 58 | Polymer 10 | PAG 1 | Amine 13 | — | ◯ | rectangular, perpendicular | ◯ |
| 59 | Polymer 11 | PAG 1 | Amine 13 | — | ◯ | rectangular, perpendicular | ◯ |

TABLE 3-continued

| Example | Polymer | Photoacid generator | N-containing compound | Dissolution inhibitor/ Crosslinker (pbw) | 0.13 μm resolution | Pattern profile | Sidewalls |
|---|---|---|---|---|---|---|---|
| 60 | Polymer 12 | PAG 1 | Amine 13 | — | ○ | rectangular, perpendicular | ○ |
| 61 | Polymer 13 | PAG 1 | Amine 13 | — | ○ | rectangular, perpendicular | ○ |

TABLE 4

| Comparative Example | Polymer | Photoacid generator | N-containing compound | 0.13 μm resolution | Pattern profile | Sidewalls |
|---|---|---|---|---|---|---|
| 15 | Polymer 9 | PAG 1 | trioctylamine | X | — | — |
| 16 | Polymer 9 | PAG 1 | 1,8-diazabicyclo[5.4.0]-7-undecene | X | — | — |
| 17 | Polymer 9 | PAG 1 | triethanolamine | ○ | rounded top, tapered | X |
| 18 | Polymer 9 | PAG 1 | tris(2-methoxyethyl)amine | Δ | rounded top, tapered | X |
| 19 | Polymer 9 | PAG 1 | 2-phenylbenzimidazole | ○ | rounded top, tapered | Δ |
| 20 | Polymer 10 | PAG 1 | triethanolamine | ○ | rounded top, tapered | X |
| 21 | Polymer 11 | PAG 1 | triethanolamine | Δ | rounded top, tapered | ○ |
| 22 | Polymer 12 | PAG 1 | triethanolamine | X | — | — |
| 23 | Polymer 13 | PAG 1 | triethanolamine | Δ | rounded top, tapered | Δ |

It is seen from the above results that the resist compositions within the scope of the invention are improved in resolution and pattern profile and minimized in pattern sidewall roughness.

The components shown in Tables—Polymers 1 to 13, PAG1 to 5, DRI, and Crosslinker—are identified below.

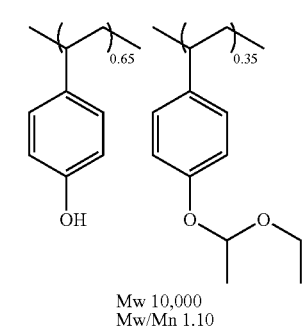

Polymer 1

Mw 10,000
Mw/Mn 1.10

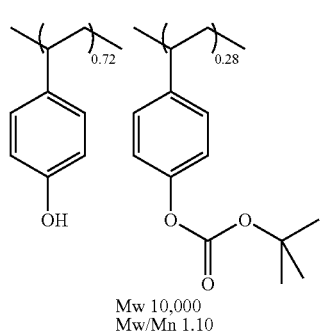

Polymer 2

Mw 10,000
Mw/Mn 1.10

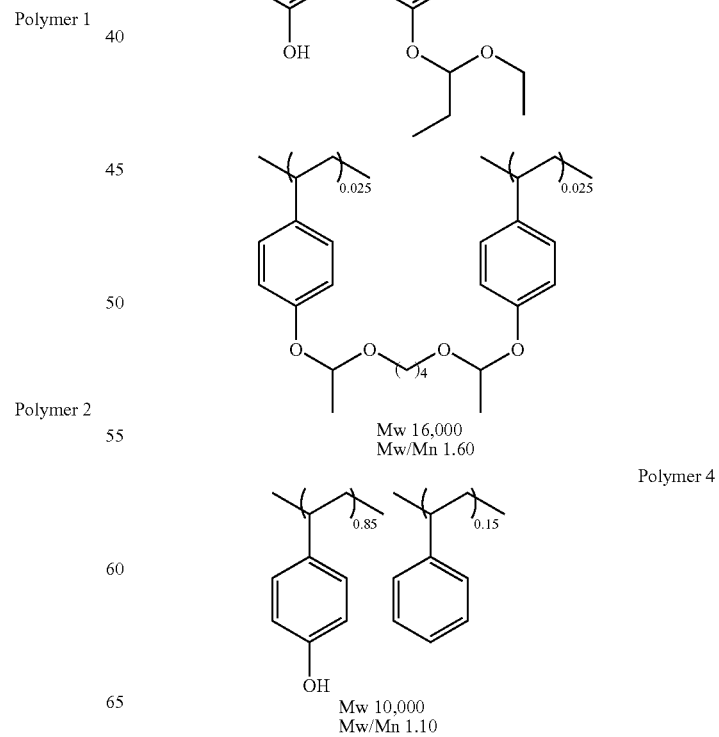

-continued

Polymer 3

Mw 16,000
Mw/Mn 1.60

Polymer 4

Mw 10,000
Mw/Mn 1.10

-continued
Polymer 5
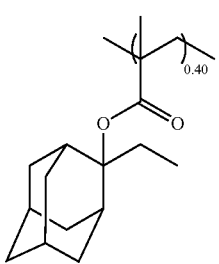
Mw 9,000
Mw/Mn 1.90
Polymer 6
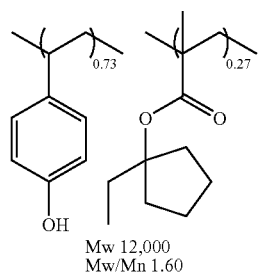
Mw 8,000
Mw/Mn 1.10
Polymer 7
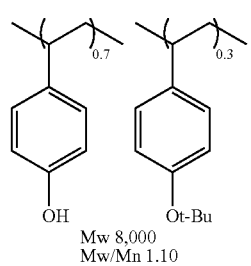
Mw 8,000
Mw/Mn 1.80
Polymer 8
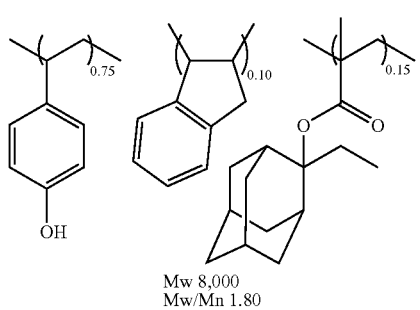
Mw 10,000
Mw/Mn 1.72
Polymer 9
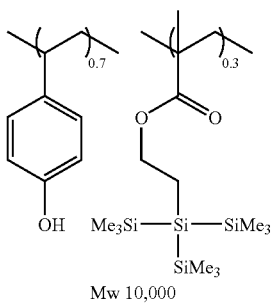
Mw 8,000
Mw/Mn 1.90
Polymer 10
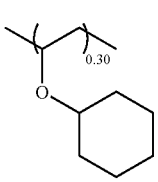
Mw 9,000
Mw/Mn 1.90
Polymer 11
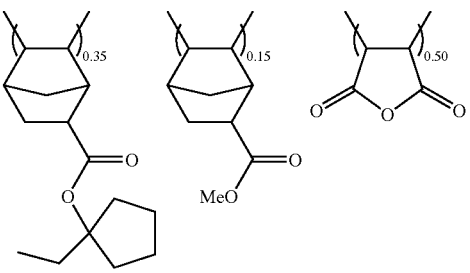
Mw 8,000
Mw/Mn 1.50
Polymer 12
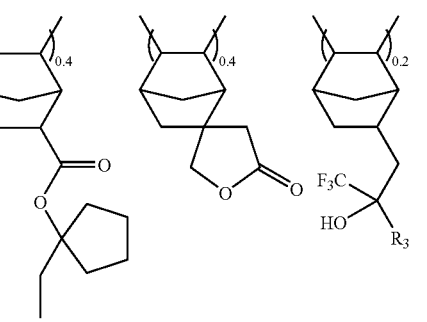
Mw 11,000
Mw/Mn 2.20
Polymer 13
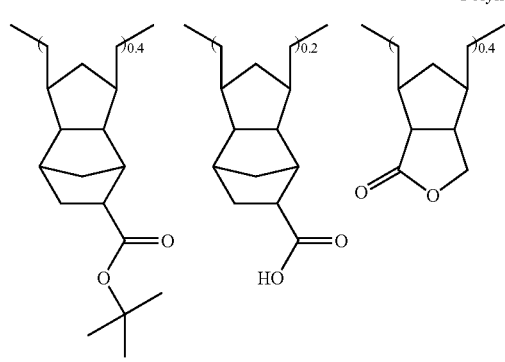
Mw 12,000
Mw/Mn 2.00

-continued

PAG1
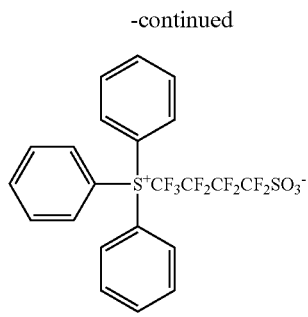

PAG2
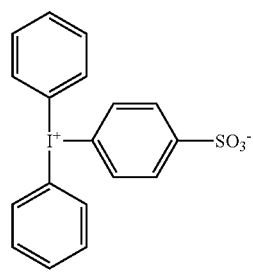

PAG3
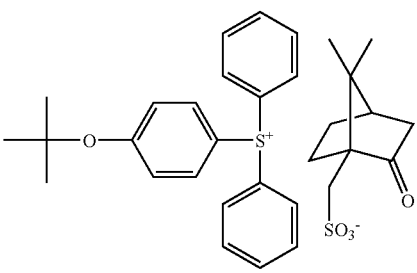

PAG4
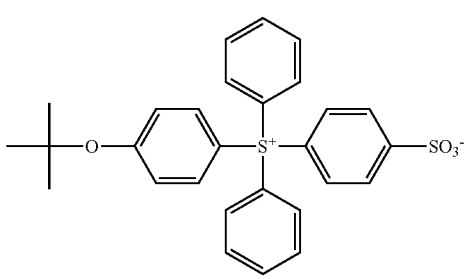

PAG5
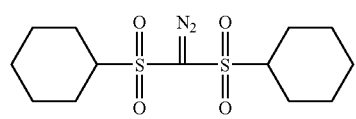

DRI
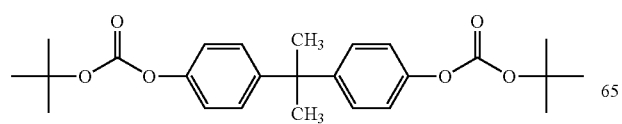

-continued

Crosslinker
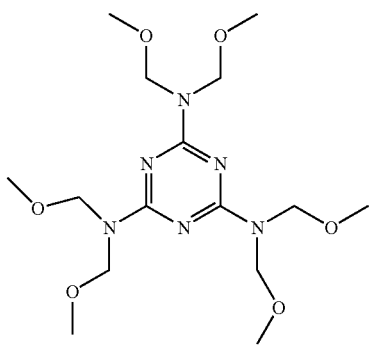

Japanese Patent Application No. 2003-368421 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A nitrogen-containing organic compound selected from the group consisting of the following formulae:

Amine 3
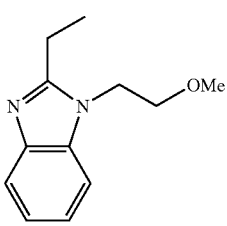

Amine 4
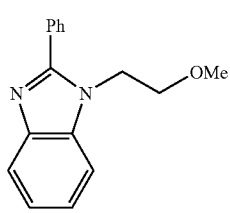

Amine 7
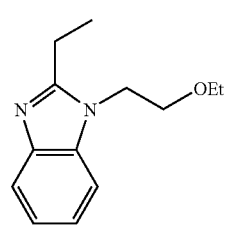

Amine 8
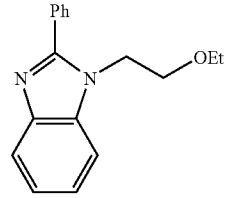

-continued
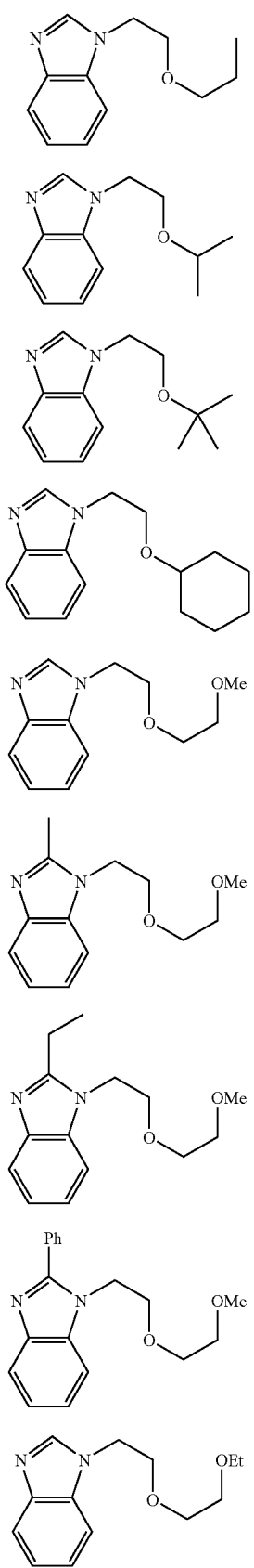
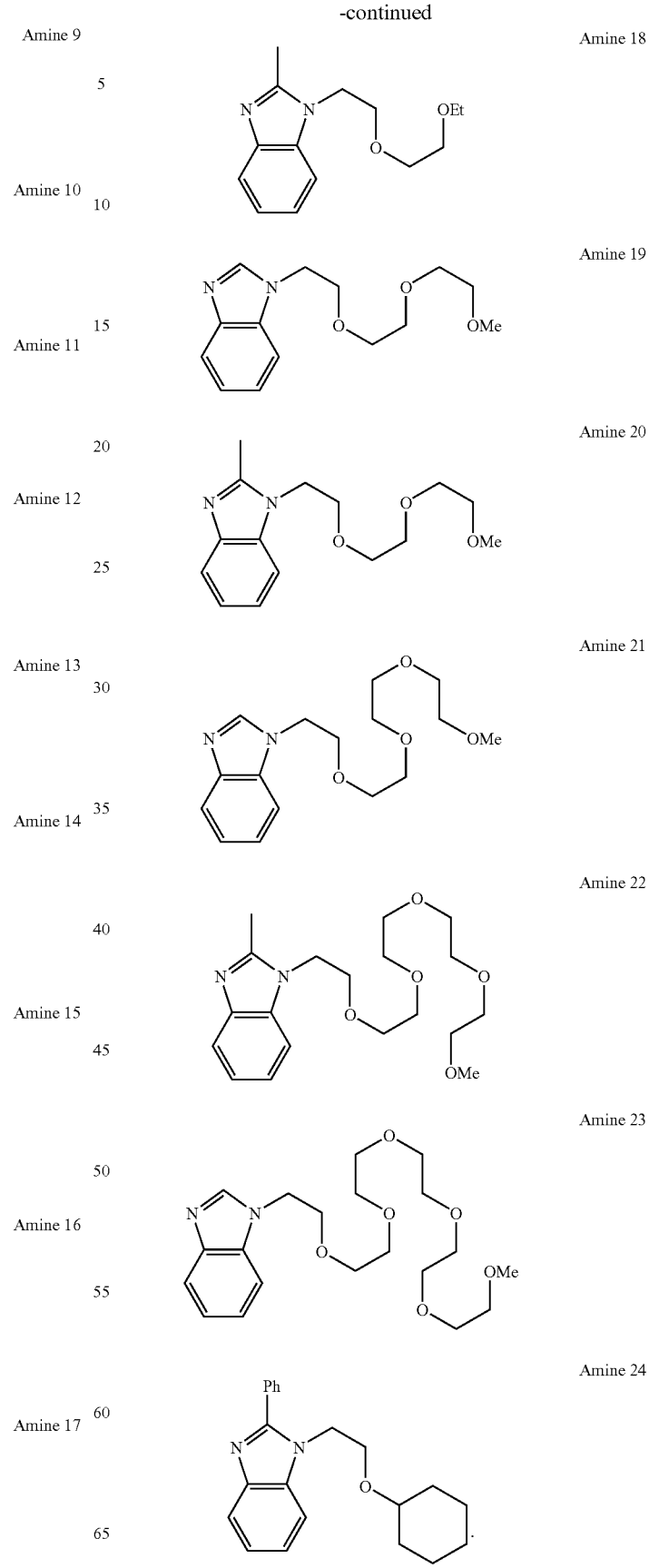

2. A positive-working chemically amplified resist composition comprising:
 (A) a nitrogen-containing organic compound having the general formula (1)

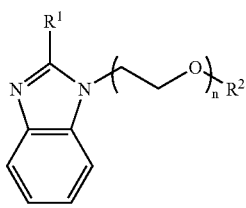

wherein R¹ is hydrogen, methyl, ethyl or phenyl, R² is a straight, branched or cyclic alkyl group of 1 to 10 carbon atoms, and n is an integer of 1 to 6;
 (B) an organic solvent;
 (C) a base resin having an acid labile group-protected acidic functional group which is alkali-insoluble or substantially alkali-insoluble, but becomes alkali-soluble when the acid labile group is eliminated; and
 (D) a photoacid generator.

3. A negative-working chemically amplified resist composition comprising:
 (A) a nitrogen-containing organic compound having the general formula (1)

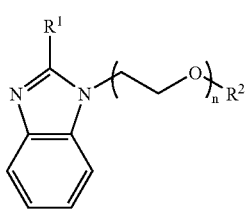

wherein R¹ is hydrogen, methyl, ethyl or phenyl, R² is a straight, branched or cyclic alkyl group of 1 to 10 carbon atoms, and n is an integer of 1 to 6;
 (B) an organic solvent;
 (C') a base resin which is alkali-soluble, but becomes substantially alkali-insoluble when crosslinked with a crosslinking agent;
 (D) a photoacid generator; and
 (E) a crosslinking agent which induces crosslinkage under the action of an acid.

4. A patterning process comprising the steps of:
 (1) applying the chemically amplified resist composition of any one of claims 2 to 3 onto a substrate;
 (2) heat treating the applied resist, then exposing the heat-treated resist through a photomask to high-energy radiation having a wavelength of up to 300 nm or an electron beam; and
 (3) heat treating the exposed resist, then developing the resist with a developer.

5. A nitrogen-containing organic compound having the general formula (1):

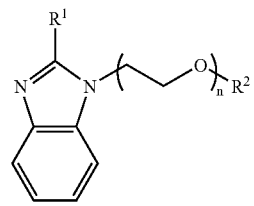

wherein R¹ is hydrogen, methyl, ethyl or phenyl, R² is a straight, branched or cyclic alkyl group of 1 to 10 carbon atoms, and n is 2, 3, 4, 5 or 6.

6. A chemically amplified resist composition comprising at least one nitrogen-containing organic compound having the general formula (1):

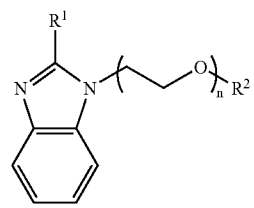

wherein R¹ is hydrogen, methyl, ethyl or phenyl, R² is a straight, branched or cyclic alkyl group of 1 to 10 carbon atoms, and n is 2, 3, 4, 5 or 6.

* * * * *